US010224832B2

(12) United States Patent
Goto et al.

(10) Patent No.: US 10,224,832 B2
(45) Date of Patent: Mar. 5, 2019

(54) POWER CONVERSION DEVICE

(71) Applicant: KABUSHIKI KAISHA TOSHIBA, Tokyo (JP)

(72) Inventors: Yuichi Goto, Hiratsuka Kanagawa (JP); Hiroshi Mochikawa, Hachioji Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 15/448,288

(22) Filed: Mar. 2, 2017

(65) Prior Publication Data

US 2018/0083551 A1   Mar. 22, 2018

(30) Foreign Application Priority Data

Sep. 16, 2016 (JP) .................. 2016-182246

(51) Int. Cl.
| | |
|---|---|
| *H02P 6/08* | (2016.01) |
| *H02P 29/66* | (2016.01) |
| *G01K 13/08* | (2006.01) |
| *G01R 31/34* | (2006.01) |
| *H02K 21/00* | (2006.01) |
| *H02P 7/28* | (2016.01) |

(Continued)

(52) U.S. Cl.
CPC .......... *H02M 7/5387* (2013.01); *H02P 6/085* (2013.01); *H02P 7/28* (2013.01); *H03K 17/687* (2013.01); *H03K 17/74* (2013.01); *H02M 2001/0051* (2013.01); *H03K 2217/0036* (2013.01); *H03K 2217/0045* (2013.01)

(58) Field of Classification Search
CPC ......... H02P 6/085; H02P 7/28; H03K 17/687; H01H 47/00; H02H 3/18
See application file for complete search history.

(56) References Cited

U.S. PATENT DOCUMENTS 6,058,037 A * 5/2000 Shibata ............. H02M 7/53873
307/116
7,724,556 B2 * 5/2010 Mochikawa ............ H02M 1/34
363/132

(Continued)

FOREIGN PATENT DOCUMENTS

| JP | H10-327585 | 12/1998 |
|---|---|---|
| JP | 4204534 | 1/2009 |

(Continued)

*Primary Examiner* — Eduardo Colon Santana
*Assistant Examiner* — Said Bouziane
(74) *Attorney, Agent, or Firm* — Kim & Stewart LLP (57) ABSTRACT

A power conversion device includes a first switch and a second switch connected in series between a positive electrode and a negative electrode of a first power supply. A first node is between the first and second switches. The first node can be connected to a load. A first diode has an anode connected to the first node and a cathode connected to the positive electrode of the first power supply. A third switch is connected between a positive electrode of a second power supply and the positive electrode of the first power supply. A first timer is connected to a gate electrode of the third switch. A first comparator has a first input that is connected to a gate electrode of the first switch, a second input at which a reference voltage can be received, and an output that is connected to the first timer.

20 Claims, 4 Drawing Sheets

(51) Int. Cl.
  *H03K 17/687* (2006.01)
  *H02M 7/5387* (2007.01)
  *H03K 17/74* (2006.01)
  *H02M 1/00* (2006.01)

(56) References Cited

U.S. PATENT DOCUMENTS

| | | | |
|---|---|---|---|
| 7,872,888 B2 | 1/2011 | Kuzumaki et al. | |
| 2009/0135636 A1* | 5/2009 | Kuzumaki | H02M 1/096 363/132 |
| 2009/0279335 A1* | 11/2009 | Noda | H02M 7/5387 363/131 |
| 2010/0328831 A1* | 12/2010 | Zhang | H02H 7/1213 361/93.1 |
| 2011/0309874 A1* | 12/2011 | Takimoto | H03K 17/0814 327/427 |
| 2013/0134958 A1* | 5/2013 | Mochikawa | H01H 47/00 323/311 |
| 2015/0236635 A1* | 8/2015 | Goto | H02P 27/06 318/504 |

FOREIGN PATENT DOCUMENTS

| | | |
|---|---|---|
| JP | 4212546 | 1/2009 |
| JP | 4772542 | 9/2011 |

\* cited by examiner

POWER CONVERSION DEVICE

CROSS-REFERENCE TO RELATED APPLICATION

This application is based upon and claims the benefit of priority from Japanese Patent Application No. 2016-182246, filed Sep. 16, 2016, the entire contents of which are incorporated herein by reference.

FIELD

Embodiments described herein relate generally to a power conversion device.

BACKGROUND

A power conversion device, such as an inverter, includes a pair of switching elements serially connected to each other for supplying power to a load, and a pair of free-wheeling diodes respectively connected in reverse parallel with the pair of switching elements. The free-wheeling diodes allow energy accumulated in the load to flow in a forward direction through one of the diodes as a free-wheeling current when a corresponding one of the switching elements is turned off.

However, if the other one of the switching elements is turned on when the free-wheeling current flows, a DC link voltage can be applied to the free-wheeling diode as a reverse bias. At this time, the free-wheeling diode is interrupted after allowing a reverse current (hereinafter, also referred to as a reverse recovery current) to flow by residual charge. Such a reverse recovery current causes large heat generation in the free-wheeling diode.

In order to prevent such heat generation, it is desired to reduce the reverse recovery current of the free-wheeling diode.

DETAILED DESCRIPTION

In general, according to one embodiment, a power conversion device includes a first switching element and a second switching element connected in series between a positive electrode and a negative electrode of a first power supply. A first node is between the first and second switching elements. The first node is connectable to a load, such as a motor. A first diode has an anode connected to the first node and a cathode connected to the positive electrode of the first power supply. A third switching element is connected between a positive electrode of a second power supply and the positive electrode of the first power supply. A first timer is connected to a gate electrode of the third switching element. A first comparator has a first input node that is connected to a gate electrode of the first switching element and a second input node at which a first reference voltage can be received. An output node of the first comparator is connected to an input of the first timer.

Hereinafter, an example embodiment will be described with reference to the drawings. The present disclosure is not limited the example embodiment.

Figure 1:
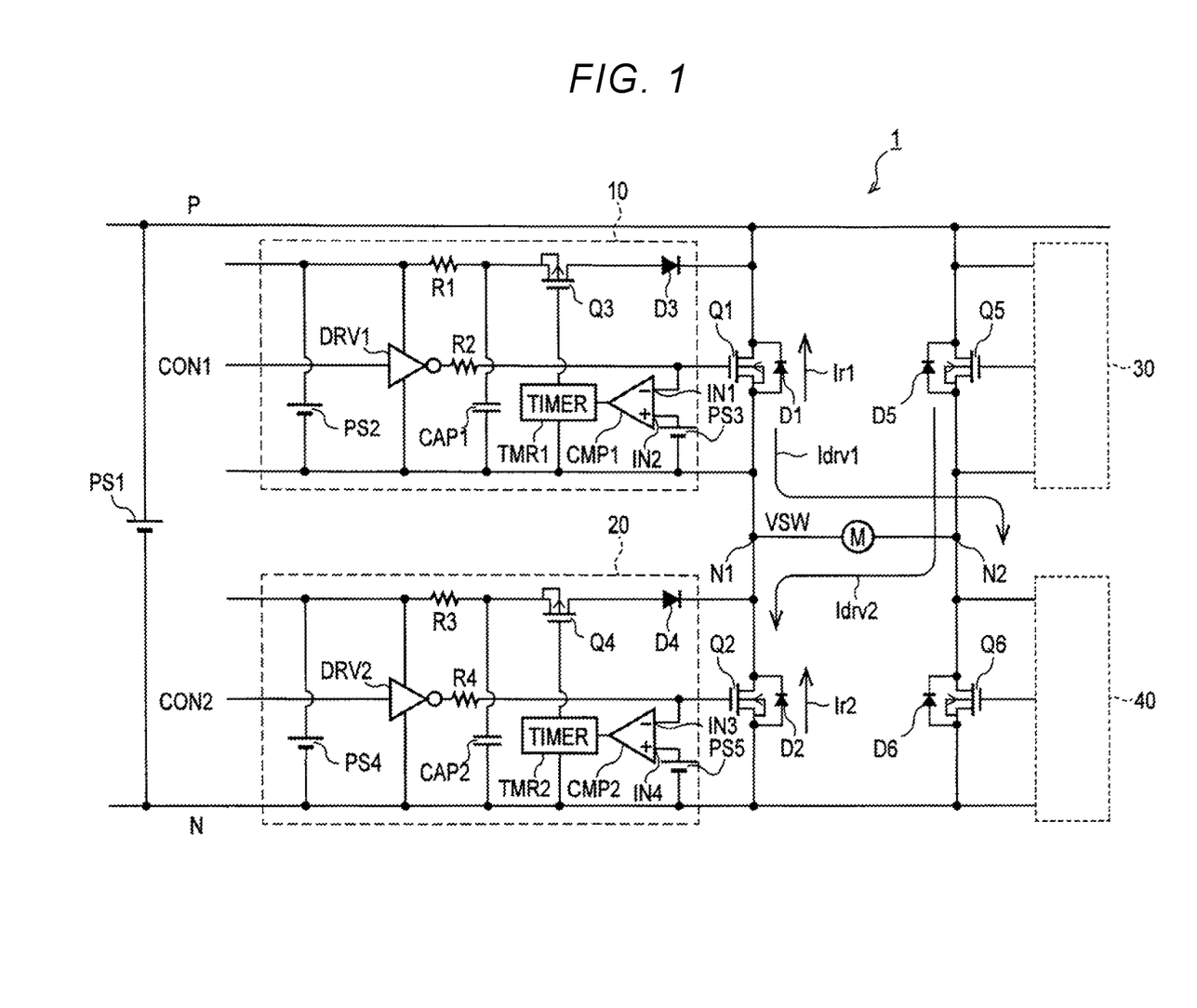
FIG. 1 is a circuit diagram illustrating an example of a power conversion device according to an embodiment.

FIG. 1 is a circuit diagram illustrating a configuration example of a power conversion device 1 according to the present embodiment. The power conversion device 1 can be used in various applications such as in an air conditioner, a power storage system, or the like as an inverter that converts DC power into AC power.

The power conversion device 1 includes switching elements Q1, Q2, Q5, and Q6; diode elements D1, D2, D5, and D6; and auxiliary circuits 10, 20, 30, and 40.

The switching elements Q1, Q2, Q5, and Q6 constitute an H bridge circuit and convert DC power from a first power supply PS1 into AC power to drive a motor M, for example. The switching elements Q1, Q2, Q5, and Q6 may be MISFETs (Metal-Insulator-Semiconductor Field Effect Transistors) and/or IGBTs (Insulated Gate Bipolar Transistors), which can switch a relative large current. The switching elements Q1, Q2, Q5, and Q6, can be N-type MISFETs, for example. The power conversion device 1 may include the motor M therein (integrated therewith), or the power conversion device 1 may be manufactured separately from the motor M and may be externally attached to and/or separable from the motor M.

The switching element Q1, as a first switching element, is connected between a first node N1, which is connectable to the motor M (a load), and a positive electrode P of the first power supply PS1. The switching element Q2, as a second switching element, is connected between the first node N1 and a negative electrode N of the first power supply PS1. That is, the switching elements Q1 and Q2 are serially connected between the positive electrode P and the negative electrode N of the first power supply PS1, and serve as a pair of inverter circuits.

The switching element Q5 is connected between a second node N2, which is connectable to the motor M, and the positive electrode P of the first power supply PS1. The switching element Q6 is connected between the second node N2 and the negative electrode N of the first power supply PS1. That is, the switching elements Q5 and Q6 are serially connected between the positive electrode P and the negative electrode N of the first power supply PS1, and serve as a pair of inverter circuits.

An anode of a diode D1 (first diode) is connected to the first node N1 (a source of the switching element Q1), and a cathode of the diode D1 is connected to the positive electrode P of the first power supply PS1 (a drain of the switching element Q1). The diode D1 can be said to be connected in reverse parallel with the switching element Q1. That is, a reverse current direction (cathode to anode direction) of diode is paired with a forward current direction (source to drain direction) with respect to a current flowing through the switching element Q1.

An anode of a diode D2 (second diode) is connected to the negative electrode N of the first power supply PS1 (a source of the switching element Q2), and a cathode of the diode D2 is connected to the first node N1 (a drain of the switching element Q2). That is, the diode D2 is connected in reverse parallel with the switching element Q2.

Similarly, the diodes D5 and D6 are connected in reverse parallel with the switching elements Q5 and Q6. Here, "connection" includes an electrical connection as well as a physical connection. Accordingly, "connection" also includes a connection via an intervening electrical element such as a resistance element (resistor) and/or a diode element (diode).

The auxiliary circuits 10, 20, 30, and 40 are provided to correspond to the switching elements Q1, Q2, Q5, and Q6, respectively. Internal configurations of the auxiliary circuits 30 and 40 may be substantially identical with (symmetrical to) those of the auxiliary circuits 10 and 20, respectively. Accordingly, in FIG. 1, internal configurations of the auxiliary circuits 10 and 20 are illustrated and the internal configurations of the auxiliary circuits 30 and 40 are not specifically illustrated.

The auxiliary circuit 10 includes a third switching element Q3, a first timer TMR1, a first comparator CMP1, a second power supply PS2, a third power supply PS3, a first capacitor element CAP1, and a first driver DRV1. When the diode D1 allows a free-wheeling current Ir1 to flow in its forward direction, the auxiliary circuit 10 allows auxiliary power to be applied in the reverse direction of the diode D1. The auxiliary power is power for suppressing the free-wheeling current Ir1 generated by energy from the motor M.

The third switching element Q3 is provided between a positive electrode of the second power supply PS2 and the drain of the switching element Q1 (the positive electrode P of the first power supply PS1). That is, one end of the third switching element Q3 is connected to the positive electrode of the second power supply PS2 via a resistance element R1. The other end of the third switching element Q3 is connected to the drain of the switching element Q1 via the diode D3. A gate electrode of the third switching element Q3 is connected to the first timer TMR1. The third switching element Q3 may be a P-type MISFET, for example. The third switching element Q3 is controlled to be in a conductive state (on) or a non-conductive state (off) by a control signal from the first timer TMR1.

The first timer TMR1 is connected between the first comparator CMP1 and the gate electrode of the third switching element Q3, and controls the third switching element Q3 according to output of the first comparator CMP1. The configuration of the first timer TMR1 will be described later with reference to FIGS. 2A and 2B.

A first input node IN1 of the first comparator CMP1 is connected to a gate electrode of the switching element Q1, and a second input node IN2 is connected to the third power supply PS3. The second input node IN2 receives a reference voltage from the third power supply PS3. The reference voltage, for example, is a voltage approximately equal to a threshold voltage of the switching element Q1. The output node of the first comparator CMP1 is connected to the first timer TMR1. The first comparator CMP1 compares a voltage (the source voltage of the switching element Q1 plus the reference voltage from the third power supply PS3) to the gate voltage of the switching element Q1, and outputs a result of the comparison.

For example, the first comparator CMP1 outputs a logic high when the gate voltage of the switching element Q1 is equal to or greater than the reference voltage and the switching element Q1 is in a conductive state. The first timer TMR1 allows the third switching element Q3 to be in a non-conductive state in this instance. On the other hand, when the gate voltage of the switching element Q1 falls below the reference voltage and the switching element Q1 is thus in a non-conductive state, the first comparator CMP1 outputs a logic low. The first timer TMR1 causes the third switching element Q3 to be in a conductive state. After switching the third switching element Q3 to the conductive state, the first timer TMR1 eventually returns the third switching element Q3 to the non-conductive state after a first period has passed.

The second power supply PS2 is connected between the third switching element Q3 and the first node N1. When the third switching element Q3 is in the conductive state, that is, when the switching element Q1 is in the non-conductive state, the second power supply PS2 supplies power to the cathode of the diode D1. In this way, when the switching element Q1 is in the non-conductive state, the auxiliary circuit 10 can suppress the free-wheeling current Ir1, which otherwise flows through the diode D1, and thus can also suppress a reverse recovery current of the diode D1. The second power supply PS2 is a voltage power supply lower than the first power supply PS1. The free-wheeling current Ir1 and the reverse recovery current will be described later with reference to FIGS. 4A and 4B.

The third power supply PS3 is connected between the first node N1 and the second input node IN2 of the first comparator CMP1, and applies a voltage (the source voltage of the switching element Q1 plus the reference voltage) that is approximately equal to the threshold voltage of the switching element Q1.

The first capacitor element CAP1 is connected between the positive electrode and the negative electrode of the second power supply PS2. The first capacitor element CAP1 is provided to quickly supply charge to the diode D1 and quickly activate auxiliary power immediately after the third switching element Q3 enters the conductive state. When the third switching element Q3 is in the non-conductive state, the first capacitor element CAP1 is charged by the second power supply PS2.

The first driver DRV1 is connected to the gate electrode of the switching element Q1 via a resistance element R2, and controls the switching element Q1 to be in the conductive state or the non-conductive state according to a control signal CON1. The first driver DRV1 is powered by the second power supply PS2 and drives the gate electrode of the switching element Q1 using the second power supply PS2. Accordingly, the auxiliary power supplied from the auxiliary circuit 10 is used as a driving power supply for the gate electrode of the switching element Q1. In this way, the auxiliary circuit 10 according to the present embodiment does not need a separate, dedicated power supply just for supplying auxiliary power to the diode D1.

The auxiliary circuit 20 has a configuration substantially similar to that of the auxiliary circuit 10, but supplies auxiliary power to the switching element Q2 rather than the switching element Q1.

The auxiliary circuit 20 includes a fourth switching element Q4, a second timer TMR2, a second comparator CMP2, a fourth power supply PS4, a fifth power supply PS5, a second capacitor element CAP2, and a second driver DRV2.

The fourth switching element Q4 is provided between a positive electrode of the fourth power supply PS4 and the drain of the switching element Q2. That is, one end of the fourth switching element Q4 is connected to the positive electrode of the fourth power supply PS4 via a resistance element R3. The other end of the fourth switching element Q4 is connected to the drain of the switching element Q2 via the diode D4. A gate electrode of the fourth switching element Q4 is connected to the second timer TMR2. The fourth switching element Q4 may be a P-type MISFET, for example. The fourth switching element Q4 is controlled by a control signal from the second timer TMR2.

The second timer TMR2 is connected between the second comparator CMP2 and the gate electrode of the fourth switching element Q4, and controls the fourth switching element Q4 according to output of the second comparator CMP2. The configuration of the second timer TMR2 can be similar to the internal configuration of the first timer TMR1.

A third input node IN3 of the comparator CMP2 is connected to the gate electrode of the switching element Q2, and a fourth input node IN4 is connected to the fifth power supply PS5. The fourth input node IN4 receives a reference voltage from the fifth power supply PS5. Here, the reference voltage is a voltage approximately equal to a threshold voltage of the switching element Q2. The output node of the second comparator CMP2 is connected to the second timer TMR2. The second comparator CMP2 compares a voltage (a source voltage of the switching element Q2 plus the reference voltage from the fifth power supply PS5) to the gate voltage of the switching element Q2, and outputs a result of the comparison.

For example, when the gate voltage of the switching element Q2 is equal to or more than the reference voltage, then the switching element Q2 is in a conductive state, and the second comparator CMP2 outputs a logic high. In this way, the second timer TMR2 allows the fourth switching element Q4 to be in a non-conductive state in this instance. On the other hand, when the gate voltage of the switching element Q2 falls below the reference voltage and the switching element Q2 is in a non-conductive state, the second comparator CMP2 outputs a low logic. In this way, the second timer TMR2 places the fourth switching element Q4 in a conductive state. After switching the fourth switching element Q4 to the conductive state, the second timer TMR2 subsequently returns the fourth switching element Q4 to the non-conductive state after a second period passes. When the characteristics of the switching elements Q1 and Q2 are approximately identical to each other and the characteristics of the diodes D1 and D2 are approximately identical with each other, it may be preferable that the second period will be set to be approximately equal to the first period.

The fourth power supply PS4 is connected between the fourth switching element Q4 and the negative electrode N of the first power supply PS1. When the fourth switching element Q4 is in the conductive state, that is, when the switching element Q2 is in the non-conductive state, the fourth power supply PS4 supplies power to the cathode of the diode D2. In this way, when the switching element Q2 is in the non-conductive state, the auxiliary circuit 20 can suppress the free-wheeling current Ir2, which otherwise flows through the diode D2, and can also suppress a reverse recovery current of the diode D2. The fourth power supply PS4 may supply a voltage lower than the first power supply PS1 and approximately equal to the second power supply PS2. The free-wheeling current Ir2 and the reverse recovery current will be described later with reference to FIGS. 4A and 4B.

The fifth power supply PS5 is connected between the negative electrode N of the first power supply PS1 and the fourth input node IN4 of the second comparator CMP2, and applies a voltage (source voltage of the switching element Q2 plus the reference voltage) approximately equal to the threshold voltage of the switching element Q2.

The second capacitor element CAP2 is connected between the positive electrode and the negative electrode of the fourth power supply PS4. The second capacitor element CAP2 is provided in order to quickly supply charge to the diode D2 and quickly activate auxiliary power immediately after the fourth switching element Q4 enters the conductive state. When the fourth switching element Q4 is in the non-conductive state, the second capacitor element CAP2 is charged by the fourth power supply PS4.

The second driver DRV2 is connected to the gate electrode of the switching element Q2 via a resistance element R4. The second driver DRV2 controls the switching element Q2 to be in the conductive state or the non-conductive state according to a control signal CON2. The second driver DRV2 receives power from the fourth power supply PS4 and drives the gate electrode of the switching element Q2 using the fourth power supply PS4. Accordingly, the auxiliary power supplied from the auxiliary circuit 20 can be used as a driving power supply of the switching element Q2. In this way, the auxiliary circuit 20 does not need a dedicated power supply just for supplying reverse power to the diode D2.

The auxiliary circuits 30 and 40 have a configuration respectively symmetrical to that of the auxiliary circuits 10 and 20, and thus performs similarly with respect to the switching elements Q5 and Q6 and the diodes D5 and D6. Since the configurations of the auxiliary circuits 30 and 40 can be easily understood from the description of the configurations of the aforementioned auxiliary circuits 10 and 20, further description thereof will be omitted.

Figure 2A:
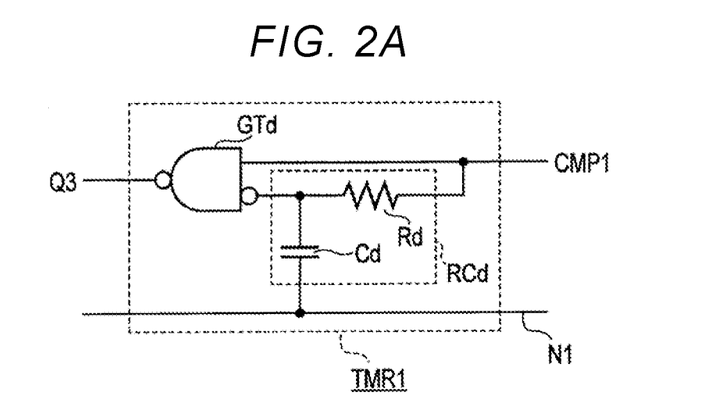
FIGS. 2A and 2B are diagrams illustrating examples of timers.
Figure 2B:
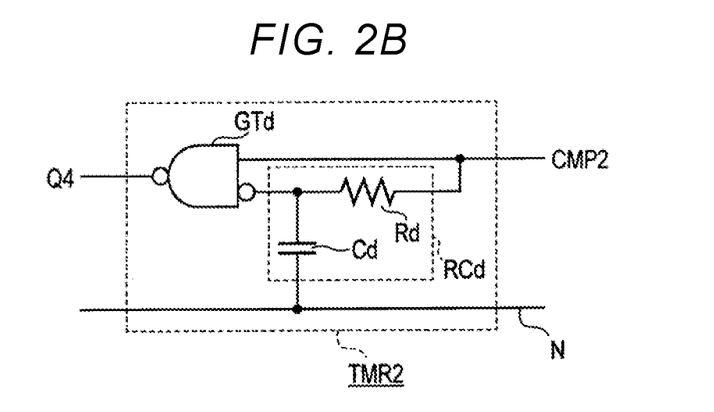

FIGS. 2A and 2B are diagrams respectively illustrating an example of configurations of the first timer TMR1 and the second timer TMR2. The first timer TMR1 of FIG. 2A includes a delay circuit RCd and a NAND gate GTd. The delay circuit RCd is connected between the first comparator CMP1 and one input node (a sixth input node) of the NAND gate GTd. The delay circuit RCd includes a resistance element Rd and a capacitor element Cd, and constitutes a CR delay circuit. The resistance element Rd is connected between the first comparator CMP1 and the sixth input node of the NAND gate GTd. The capacitor element Cd is connected between the first node N1 and the sixth input node of the NAND gate GTd. In this way, the delay circuit RCd delays a signal from the first comparator CMP1 by a first period and outputs the delayed signal to the NAND gate GTd.

The NAND gate GTd includes a fifth input node that receives the output from the first comparator CMP1 with lesser delay, the sixth input node that receives an inverted signal output from the delay circuit RCd, and an output node that outputs the NAND operation results on signals from the fifth and sixth input nodes.

An output signal from the first comparator CMP1 is inputted to the fifth input node of the NAND gate GTd with less delay. On the other hand, the output signal from the first comparator CMP1 is concurrently inputted to the delay circuit RCd. The delay circuit RCd delays the output signal from the first comparator CMP1 by the first period, and also inverts this signal. This inverted signal is inputted to the sixth input node of the NAND gate GTd. In this way, after the output signal of the first comparator CMP1 is inverted from a logic low to a logic high, the NAND gate GTd outputs a logic low signal for the first period, and maintains a logic high signal in other cases. That is, after the gate voltage of the switching element Q1 falls below the reference voltage, the first timer TMR1 allows the third switching element Q3 to stay in the conductive state for the first period. In other cases, the first timer TMR1 maintains the third switching element Q3 in the non-conductive state.

The configuration of the second timer TMR2 of FIG. 2B is similar to that of the first timer TMR1. A delay circuit RCd of the second timer TMR2 delays a signal from the first comparator CMP1 by the second period, and outputs this delayed signal to the NAND gate GTd. When the second period is equal to the first period, the characteristics of a resistance element Rd and a capacitor element Cd in the delay circuit RCd of the second timer TMR2 may be approximately identical with those of the first timer TMR1. In this way, after the gate voltage of the switching element Q2 falls below the reference voltage, the second timer TMR2 allows the fourth switching element Q4 to stay in the conductive state for the second period. In other cases, the second timer TMR2 maintains the fourth switching element Q4 in the non-conductive state.

Next, an operation of the power conversion device 1 will be described.

Figure 3:
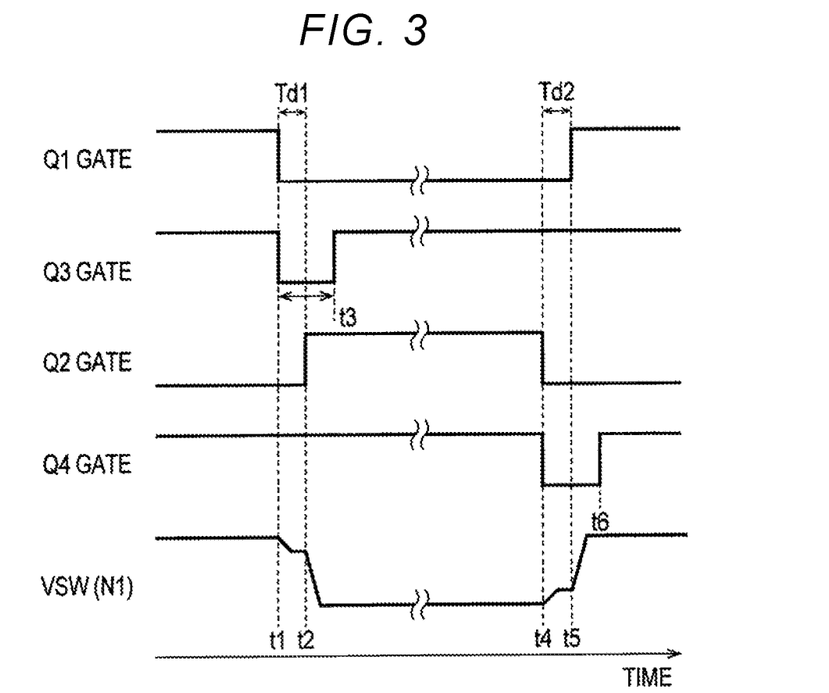
FIG. 3 is a timing diagram illustrating an operating example of the power conversion device according to the embodiment.

FIG. 3 is a timing diagram illustrating an operational example of the power conversion device 1 according to the present embodiment. A horizontal axis denotes a time. A vertical axis denotes respective gate voltages of the switching elements Q1 to Q4 and the voltage of the first node N1.

Before t1, the gate voltage of the switching element Q1 is a logic high value and the switching element Q1 is in the conductive state. The gate voltage of the switching element Q2 is a logic low value and the switching element Q2 is in the non-conductive state. In this way, the switching element Q1 allows the driving current Idrv1 to flow, thereby driving the motor M. The switching element Q6 of FIG. 1 operates similarly to the switching element Q1, and the switching element Q5 operates similarly to the switching element Q2. Accordingly, at this time, the driving current Idrv1 flowing through the switching element Q1 flows to the negative electrode N via the switching element Q6. In contrast, when the switching element Q2 allows the driving current Idrv2 to flow, the driving current Idrv2 flows to the negative electrode N via the switching element Q5.

At t1, the gate voltage of the switching element Q1 becomes logic low from logic high and the switching element Q1 enters the non-conductive state from the conductive state. At this time, the free-wheeling current Ir1 flows in the forward direction of the diode D1 due to energy of the motor M (for example, electromotive force of the motor M). On the other hand, the gate voltage of the switching element Q1 becomes logic low from logic high, so that the first comparator CMP1 of the auxiliary circuit 10 starts the first timer TMR1 and the operation of the first timer TMR1 causes the third switching element Q3 to be in the conductive state. For example, the first timer TMR1 outputs the logic low value, so that the gate voltage of the third switching element Q3 becomes the logic low value as illustrated in FIG. 3. At this time, the first timer TMR1 starts timing (begins the first period). Since the third switching element Q3 is a P-type MISFET, the third switching element Q3 enters the conductive state when the gate voltage is the logic low value. In this way, the auxiliary circuit 10 supplies the diode D1 with auxiliary power opposing the free-wheeling current Ir1. That is, the auxiliary circuit 10 applies a voltage in a direction for suppressing the free-wheeling current Ir1 that would otherwise flow through the diode D1. As described above, the auxiliary circuit 10 applies a reverse voltage, resulting in the suppression of the free-wheeling current Ir1 and/or the shortening of a time (a free-wheeling time) for which the free-wheeling current Ir1 flows. The free-wheeling current Ir1 is suppressed, resulting in the suppression of a reverse recovery current and the shortening of a reverse recovery time. The shortening of the free-wheeling time and the reverse recovery time shortens a dead time Td1 after the switching element Q1 enters the non-conductive state until the switching element Q2 enters the conductive state. The free-wheeling current and the reverse recovery current will be described later with reference to FIGS. 4A and 4B.

At t2, the gate voltage of the switching element Q2 becomes the logic high value from the logic low value, so that the switching element Q2 enters the conductive state. Immediately after t2, since the driving current Idrv1 is switched to the driving current Idrv2, a voltage VSW of the first node N1 is lowered.

At t3, the first timer TMR1 returns the gate voltage of the third switching element Q3 to logic high. In this way, the third switching element Q3 enters the non-conductive state, so that the auxiliary circuit 10 stops the supply of auxiliary power. The first period (t1 to t3) is a period equal to or greater than the dead time Td1 (t1 to t2). That is, the first period is a period equal to or greater than a period from when the gate voltage of the switching element Q1 falls below the reference voltage until the switching element Q2 enters the conductive state. In this way, the auxiliary circuit 10 can apply auxiliary power to the diode D1 over a period equal to or greater than a period in which the diode D1 permits the free-wheeling current Ir1 to flow.

At t3 to t4, the switching element Q2 allows the driving current Idrv2 to flow.

At t4, the gate voltage of the switching element Q2 becomes the logic low value from the logic high value and the switching element Q2 enters the non-conductive state from the conductive state. At this time, the free-wheeling current Ir2 flows in the forward direction of the diode D2 due to the energy of the motor M. On the other hand, the gate voltage of the switching element Q2 becomes logic low from logic high, so that the second comparator CMP2 of the auxiliary circuit 20 starts the second timer TMR2 and the second timer TMR2 allows the fourth switching element Q4 to be in the conductive state. For example, the second timer TMR2 outputs the logic low value, so that the gate voltage of the fourth switching element Q4 becomes logic low as illustrated in FIG. 3. At this time, the second timer TMR2 starts timing of the second period. Since the fourth switching element Q4 is a P-type MISFET, the fourth switching element Q4 enters the conductive state. In this way, the auxiliary circuit 20 supplies the diode D2 with auxiliary power opposing the free-wheeling current Ir2. That is, the auxiliary circuit 20 applies a voltage in a direction for suppressing the free-wheeling current Ir2 otherwise flowing through the diode D2. As described above, the auxiliary circuit 20 applies the reverse voltage, resulting in the suppression of the free-wheeling current Ir2 or the shortening of a time (a free-wheeling time) for which the free-wheeling current Ir2 flows. The free-wheeling current Ir2 is suppressed, resulting in the suppression of a reverse recovery current and the shortening of a reverse recovery time. The shortening of the free-wheeling time and the reverse recovery time shortens a dead time Td2 from when the switching element Q2 enters the non-conductive state until the switching element Q1 enters the conductive state.

At t5, the gate voltage of the switching element Q1 becomes logic high from logic low, so that the switching element Q1 enters the conductive state. Immediately after t5, since the driving current Idrv2 is switched to the driving current Idrv1, the voltage VSW of the first node N1 rises.

At t6, the second timer TMR2 returns the gate voltage of the fourth switching element Q4 to logic high. In this way, the fourth switching element Q4 enters the non-conductive state, so that the auxiliary circuit 20 stops the supply of auxiliary power. The second period t4 to t6 is a period equal to or greater than the dead time Td2 (t4 to t5). In this way, the auxiliary circuit 20 can apply auxiliary power to the diode D2 over a period equal to or greater than a period in which the free-wheeling current Ir2 flows through the diode D2.

Thereafter, the power conversion device 1 repeats the operations at t1 to t6. In this way, the power conversion device 1 converts DC power of the first power supply PS1 into AC power, thereby driving the motor M.

Next, the free-wheeling current and the reverse recovery current flowing from t1 to t2 and from t4 to t5 will be described.

Figure 4A:
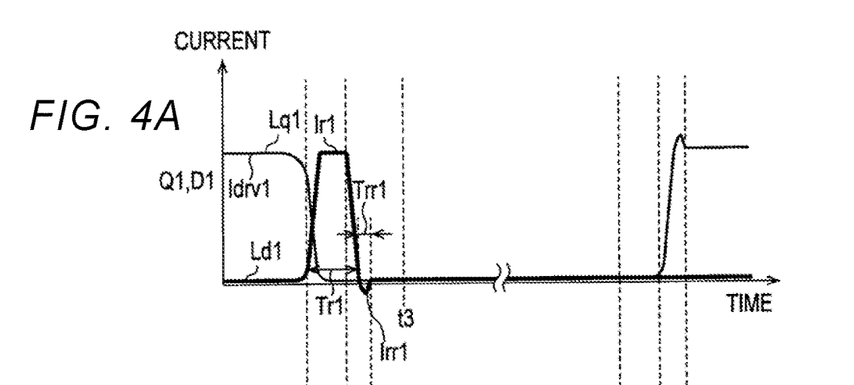
FIGS. 4A and 4B are graphs illustrating driving currents flowing through switching elements and free-wheeling currents and reverse recovery currents flowing through diodes in power conversion devices.

FIG. 4A is a graph illustrating the driving current Idrv1 flowing through the switching element Q1 and the free-wheeling current Ir1 and a reverse recovery current Irr1 flowing through the diode D1.

Figure 4B:
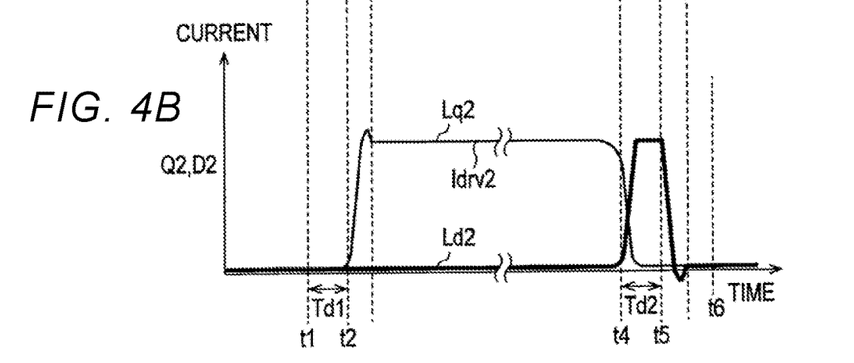

FIG. 4B is a graph illustrating the driving current Idrv2 flowing through the switching element Q2 and the free-wheeling current Ir2 and a reverse recovery current Irr2 flowing through the diode D2.

The line Lq1 indicates current flowing through the switching element Q1 and the line Ld1 indicates current flowing through the diode D1. The line Lq2 indicates current flowing through the switching element Q2 and the line Ld2 indicates current flowing through the diode D2.

At t1, the gate voltage of the switching element Q1 is lowered, as illustrated in FIG. 3, the driving current Idrv1 flowing through the switching element Q1 is lowered, as indicated by the line Lq1 of FIG. 4A, since the switching element Q1 enters the non-conductive state. At this time, the free-wheeling current Ir1 from the motor M flows in the forward direction of the diode D1. Accordingly, as indicated by the line Ld1, the free-wheeling current Ir1 flows through the diode D1.

The third switching element Q3 of the auxiliary circuit 10 enters the conductive state, so that the auxiliary circuit 10 supplies auxiliary power to the diode D1. Accordingly, the free-wheeling current Ir1 flowing through the diode D1 is suppressed, resulting in the shortening of a free-wheeling time Tr1 for which the free-wheeling current Ir1 flows. For example, the free-wheeling time Tr1 can be shortened to be equal to or less than about ⅓ of a free-wheeling time when the auxiliary circuit 10 is not present. For example, the free-wheeling time can be shortened to about 300 nanoseconds (ns) from about 1 microsecond (μs) by the inclusion of the auxiliary circuit 10. The shortening of the free-wheeling time Tr1 results in the shortening of the dead time Td1.

Moreover, when the free-wheeling current Ir1 flowing through the diode D1 is reduced, the reverse recovery current Irr1 generated after t2 is also reduced. For example, when the forward free-wheeling current Ir1 flows through the diode D1, if the switching element Q2 enters the conductive state as illustrated in FIG. 4B, a DC link voltage is applied to both ends of the diode D1 in a reverse direction. At this time, the reverse recovery current Irr1 of the reverse direction flows through the diode D1 due to residual charge, and then the diode D1 is interrupted. Such a reverse recovery current Irr1 is suppressed by reducing the free-wheeling current Ir1 and the free-wheeling time Tr1. As a consequence, a reverse recovery time Trr1 from the time reverse recovery current Irr1 is generated until the reverse recovery current Irr1 becomes almost zero is also shortened. The reverse recovery time Trr1 can also be shortened to be equal to or less than about ⅓ of a reverse recovery time when the auxiliary circuit 10 is not present. For example, the reverse recovery time Trr1 can be shortened to about 100 ns from about 300 ns. By shortening the reverse recovery time Trr1 and shortening the dead time Td1, motor driving capabilities or motor operating rates of the switching elements Q1, Q2, Q5, and Q6 are improved, so that it is possible to more efficiently drive the motor M.

Moreover, since the free-wheeling current Ir1 and the reverse recovery current Irr1 are suppressed, the required charge amount until the diode D1 is interrupted is reduced and thus heating due to operation of the diode D1 is also lowered. In this way, it is possible to lower the heating caused by the switching operation(s) of the power conversion device 1.

At t2 to t4, the switching element Q2 allows the driving current Idrv2 to flow to the motor M.

At t4, when the gate voltage of the switching element Q2 is lowered, the switching element Q2 enters the non-conductive state, and the driving current Idrv2 flowing through the switching element Q2 is lowered as indicated by the line Lq2 of FIG. 4B. At this time, the free-wheeling current Ir2 from the motor M flows in the forward direction of the diode D2. Accordingly, as indicated by the line Ld2, the free-wheeling current Ir2 flows through the diode D2.

At this time, the fourth switching element Q4 of the auxiliary circuit 20 enters the conductive state, so that the auxiliary circuit 20 supplies auxiliary power to the diode D2. Accordingly, the free-wheeling current Ir2 flowing through the diode D2 is suppressed, which results in the shortening of a free-wheeling time Tr2 over which the free-wheeling current Ir2 flows. The shortening of the free-wheeling time Tr2 results in the shortening of the dead time Td2.

Moreover, when the free-wheeling current Ir2 flowing through the diode D2 is reduced, the reverse recovery current Irr2 generated after t5 is also reduced. The reverse recovery current Irr2 is suppressed by reducing the free-wheeling current Ir2 and the free-wheeling time Tr2. As a consequence, a reverse recovery time Trr2 starting when the reverse recovery current Irr2 is generated until the reverse recovery current Irr2 becomes almost zero is also shortened. By shortening of reverse recovery time Trr2 and shortening of dead time Td2, the motor driving capabilities or the motor operating rates of the switching elements Q1, Q2, Q5, and Q6 are improved, so that it is possible to more efficiently drive the motor M.

Moreover, the free-wheeling current Ir2 and the reverse recovery current Irr2 are suppressed, so that a required charge amount until the diode D2 is interrupted is reduced and heating due to the diode D2 is also lowered. In this way, it is possible to reduce heating due to the switching operation(s) of the power conversion device 1.

The switching elements Q5 and Q6 and the auxiliary circuits 30 and 40 respectively operate similarly to the switching elements Q2 and Q1 and the auxiliary circuits 20 and 10.

As described above, in the power conversion device 1 according to the present embodiment, whenever the switching elements Q1 and Q2 switch the driving currents Idrv1 and Idrv2, the diodes D1 and D2 allow the free-wheeling currents Ir1 and Ir2 to flow. Similarly, whenever the switching elements Q5 and Q6 switch driving currents, the diodes D5 and D6 also allow free-wheeling currents to flow. At this time, the auxiliary circuits 10, 20, 30, and 40 can each operate so as to suppress free-wheeling currents, can suppress the free-wheeling currents flowing through the diodes D1, D2, D5, and D6, and can also suppress reverse recovery currents. In this way, it is possible to reduce heat generated by the switching operation(s). Furthermore, since the free-wheeling currents are suppressed, the dead times Td1 and Td2 and the reverse recovery times Trr1 and Trr2 are shortened. In this way, the power conversion device 1 can improve a motor driving capability, thereby more efficiently driving the motor M.

Furthermore, according to the present embodiment, the first and second comparators CMP1 and CMP2 monitor the gate voltages of the switching elements Q1 and Q2 and detect when the gate voltages falls below the reference voltage, thereby starting the timers TMR1 and TMR2. The timers TMR1 and TMR2 permit the switching elements Q3 and Q4 to be in the conductive state for a predetermined period after the gate voltages of the switching element (Q1 and Q2) falls below the reference voltage. As described above, the power conversion device 1 can supply auxiliary power for the predetermined period without reference to any further external control signal.

In circuits in which an additional external control signal is required, the necessary external control circuit is complicated in design. Furthermore, the external control signal has a difficulty in adapting the operations and timings of the switching elements Q1 and Q2.

In contrast, according to the present embodiment, since an external control signal is not required, the power conversion device 1 can be achieved in a relatively simple configuration. Furthermore, according to the present embodiment, the auxiliary circuits 10 and 20 allow the switching elements Q3 and Q4 to be automatically in the conductive state at timings at which turning-off of the switching elements Q1 and Q2 is detected. Accordingly, the power conversion device 1 can easily adapt the supply of auxiliary power to the turning-off timings of the switching elements Q1 and Q2.

The power conversion device 1 according to the present embodiment is applied to a two-phase AC motor. However, in other embodiments, the power conversion device 1 may also be applied to a three-phase AC motor. In this case, it is sufficient if the auxiliary circuits 10 and 20 according to the aforementioned embodiment are respectively provided to three switching element pairs.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A power conversion device, comprising:
    a first switching element and a second switching element connected in series between a positive electrode and a negative electrode of a first power supply;
    a first node between the first and second switching elements, the first node being connectable to a load;
    a first diode having an anode connected to the first node and a cathode connected to the positive electrode of the first power supply;
    a third switching element connected between a positive electrode of a second power supply and the positive electrode of the first power supply;
    a first timer connected to a gate electrode of the third switching element; and
    a first comparator having a first input node that is connected to a gate electrode of the first switching element, a second input node at which a first reference voltage can be received, and an output node that is connected to an input of the first timer.

2. The power conversion device according to claim 1, further comprising:
    a third power supply connected between the second input node and the first node and providing the first reference voltage.

3. The power conversion device according to claim 2, wherein the third power supply supplies a voltage that is approximately equal to a threshold voltage of the first switching element to the second input node.

4. The power conversion device according to claim 1, further comprising:
    a first capacitor connected between the positive electrode of the second power supply and a negative electrode of the second power supply.

5. The power conversion device according to claim 1, further comprising:
    a first driver circuit connected to the gate electrode of the first switching element, wherein
    the second power supply powers the first driver circuit.

6. The power conversion device according to claim 1, wherein
    the first comparator outputs a signal to the first timer to start the first timer counting a predetermined first time period when a gate voltage of the first switching element falls below the first reference voltage, and
    the first timer outputs a first timer signal to the gate electrode of the third switching element which allows the third switching element to be in a conductive state for at least the predetermined first time period after the first comparator outputs the signal to first timer to start the first timer counting.

7. The power conversion device according to claim 6, wherein the predetermined first time period is equal to or more than a time period starting from when the gate voltage of the first switching element falls below the first reference voltage and lasting until the second switching element enters a conductive state.

8. The power conversion device according to claim 1, further comprising:
    a second diode having an anode connected to the negative electrode of the first power supply and a cathode connected to the first node;
    a fourth switching element connected between a positive electrode of a fourth power supply and the first node;
    a second timer connected to a gate electrode of the fourth switching element; and
    a second comparator having a third input node connected to a gate electrode of the second switching element, a fourth input node at which a second reference voltage can be received, and an output node connected to an input of the second timer.

9. A power conversion device, comprising:
    a positive electrode and a negative electrode connectable to a first power supply;
    a first switching element connected between the positive electrode and a first node;
    a second switching element connected between the negative electrode and the first node;
    a third switching element connected between the positive electrode and a second node;
    a fourth switching element connected between the negative electrode and the second node;
    a first diode having an anode connected to the first node and a cathode connected to the positive electrode of the first power supply, the first diode being connected in parallel with the first switching element between the positive electrode and the first node;
a first auxiliary power circuit receiving a first control signal for controlling the first switching element and connected to a gate of the first switching element, the first auxiliary power circuit comprising:
a fifth switching element connected between a positive electrode of a second power supply and the positive electrode of the first power supply;
a first timer connected to a gate electrode of the fifth switching element; and
a first comparator having a first input node that is connected to the gate electrode of the first switching element, a second input node at which a first reference voltage can be received, and an output node that is connected to an input of the first timer.

10. The power conversion device according to claim 9, wherein the first auxiliary power circuit further comprises:
a third power supply connected between the second input node and the first node and providing the first reference voltage;
a first capacitor connected between the positive electrode of the second power supply and a negative electrode of the second power supply; and
a first driver circuit connected to the gate electrode of the first switching element, wherein
the second power supply powers the first driver circuit.

11. The power conversion device according to claim 10, wherein
the first comparator outputs a signal to the first timer to start the first timer counting a predetermined first time period when a gate voltage of the first switching element falls below the first reference voltage, and
the first timer outputs a first timer signal to the gate electrode of the fifth switching element which allows the fifth switching element to be in a conductive state for at least the predetermined first time period after the first comparator outputs the signal to first timer to start the first timer counting.

12. The power conversion device according to claim 11, further comprising:
an alternating-current motor connected to the first node and the second node.

13. The power conversion device according to claim 9, further comprising:
an alternating-current motor connected to the first node and the second node.

14. The power conversion device according to claim 9, wherein the first, second, third, and fourth switching elements are metal-insulator-semiconductor field effect transistors.

15. The power conversion device according to claim 9, wherein the first, second, third, and fourth switching elements are insulated gate bipolar transistors.

16. The power conversion device according to claim 9, further comprising:
a second auxiliary power circuit receiving a second control signal for controlling the second switching element and connected to a gate of the second switching element;
a third auxiliary power circuit receiving a third control signal for controlling the third switching element and connected to a gate of the third switching element; and
a fourth auxiliary power circuit receiving a fourth control signal for controlling the fourth switching element and connected to a gate of the fourth switching element.

17. The power conversion device according to claim 16, wherein each of the second, third, and fourth axillary power circuits include a timer.

18. A power conversion device, comprising:
a first electrode and a second electrode connectable to a first power supply;
a first switching element connected between the first electrode and a first node that is connectable to a load;
a second switching element connected between the first node and the second electrode;
a first diode having a cathode connected to the first electrode and an anode connected to the first node;
a second diode having a cathode connected to the first node and an anode connected to the second electrode;
a first auxiliary power circuit with a second node connected to a gate of the first switching element; and
a second auxiliary power circuit with a third node connected to a gate of the second switching element, wherein
the first auxiliary power circuit includes:
a first driver circuit connected to the second node and configured to control the first switching element according to a first control signal, the first driver circuit being powered by a second power supply,
a first comparator having a first input terminal connected to the second node and a second input terminal receiving a first predetermined reference voltage and configured to output a first timer signal when a gate voltage of the first switching element is less than the first predetermined reference voltage,
a first timer connected to an output of the first comparator and receiving the first timer signal from the first comparator, the first timer being configured to begin a first predetermined time period upon receiving the first timer signal, and
a third switching element connected between an electrode of the second power supply and a drain of the first switching element, a gate of the third switching element connected to the first timer, the third switching element being controlled according to a control signal output from the first timer.

19. The power conversion device according to claim 18, wherein the second auxiliary power circuit includes:
a second driver circuit connected to the third node and configured to control the second switching element according to a second control signal, the second driver circuit being powered by a third power supply,
a second comparator having a first input terminal connected to third node and a second input terminal receiving a second predetermined reference voltage and configured to output a second timer signal when a gate voltage of the second switching element is less than the second predetermined reference voltage,
a second timer connected to an output of the second comparator and receiving the second timer signal from the second comparator, the second timer being configured to begin a second predetermined time period upon receiving the second timer signal, and
a fourth switching element connected between an electrode of the third power supply and a drain of the second switching element, a gate of the fourth switching element connected to the second timer, the fourth switching element being controlled according to a control signal output from the second timer.

20. The power conversion device according to claim 19, wherein the first predetermined time is equal in length of time to the second predetermined time.

\* \* \* \* \*